(12) United States Patent
Kimura

(10) Patent No.: US 7,161,241 B2
(45) Date of Patent: Jan. 9, 2007

(54) MULTI-LAYER BOARD

(75) Inventor: Junichi Kimura, Aichi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/092,548

(22) Filed: Mar. 8, 2002

(65) Prior Publication Data
US 2003/0168727 A1 Sep. 11, 2003

(51) Int. Cl.
*H01L 23/34* (2006.01)
(52) U.S. Cl. .................................. 257/724; 257/728
(58) Field of Classification Search ......... 257/700–777
See application file for complete search history.

(56) References Cited

U.S. PATENT DOCUMENTS

| | | | | |
|---|---|---|---|---|
| 5,331,204 | A * | 7/1994 | Kuroda et al. ............... | 257/758 |
| 5,396,397 | A * | 3/1995 | McClanahan et al. ...... | 361/313 |
| 6,028,364 | A * | 2/2000 | Ogino et al. ................ | 257/778 |
| 6,127,633 | A * | 10/2000 | Kinoshita .................... | 174/259 |
| 6,183,669 | B1 * | 2/2001 | Kubota et al. ........... | 156/89.16 |
| 6,254,971 | B1 * | 7/2001 | Katayose et al. ............ | 428/209 |
| 6,291,884 | B1 * | 9/2001 | Glenn et al. ................. | 257/747 |
| 6,333,857 | B1 * | 12/2001 | Kanbe et al. ................ | 361/792 |
| 6,351,393 | B1 * | 2/2002 | Kresge et al. ............... | 361/795 |
| 6,373,717 | B1 * | 4/2002 | Downes et al. .............. | 361/795 |
| 6,392,898 | B1 * | 5/2002 | Asai et al. ................... | 361/794 |
| 6,545,353 | B1 * | 4/2003 | Mashino ...................... | 257/724 |
| 6,570,469 | B1 * | 5/2003 | Yamada et al. .............. | 333/193 |
| 6,586,682 | B1 * | 7/2003 | Strandberg ................... | 174/255 |
| 6,734,542 | B1 * | 5/2004 | Nakatani et al. ............. | 257/687 |
| 6,762,498 | B1 * | 7/2004 | Morrison et al. ............ | 257/758 |
| 6,777,771 | B1 * | 8/2004 | Marumoto et al. .......... | 257/500 |
| 6,794,743 | B1 * | 9/2004 | Lamson et al. .............. | 257/691 |
| 6,908,960 | B1 * | 6/2005 | Takaya et al. ............... | 524/494 |
| 2001/0008309 | A1 * | 7/2001 | Iijima et al. ................. | 257/737 |
| 2002/0027282 | A1 * | 3/2002 | Kawakami et al. .......... | 257/700 |
| 2002/0100966 | A1 * | 8/2002 | Hayama et al. .............. | 257/700 |
| 2002/0118523 | A1 * | 8/2002 | Okabe et al. ................ | 361/793 |
| 2002/0122283 | A1 * | 9/2002 | Higashi et al. .............. | 361/271 |
| 2002/0175402 | A1 * | 11/2002 | McCormack et al. ........ | 257/700 |
| 2004/0158980 | A1 * | 8/2004 | Nakatani et al. ............. | 29/852 |

* cited by examiner

*Primary Examiner*—Nathan W. Ha
(74) *Attorney, Agent, or Firm*—Wenderoth, Lind & Ponack, L.L.P.

(57) ABSTRACT

A multi-layer board includes a ceramic layer and plural resin layers which are stacked together. The ceramic layer is provided with an impedance element formed thereon, and the uppermost resin layer is provided with an electronic component mounted thereon. The multi-layer board is stable against a temperature change.

33 Claims, 3 Drawing Sheets

MULTI-LAYER BOARD

FIELD OF THE INVENTION

The present invention relates to a multi-layer board used in small electronic equipment such as a portable telephone.

BACKGROUND OF THE INVENTION

As shown in FIG. 4, a conventional multi-layer board is formed with resin layers. For example, on a first surface 1, a patterned is formed, and an electronic component 2 is mounted. The electronic component 2 is conducted to a second surface 4, third surface 5 or fourth surface 6 with a through hole 3 in order to be connected to a component such as an inductor formed on the surface 4, 5 or 6. Intervals between any of the first surface 1 through the fourth surface 6 are filled with a resin 7.

The conventional multi-layer board consisting of the resin layers, upon having the inductor formed thereon, shrinks with heat due to a temperature change, thus causing a characteristic such as an inductance to vary.

SUMMARY OF THE INVENTION

A multi-layer board has mechanical and electric characteristics stabilized against a temperature change. The multi-layer board includes a ceramic layer, a resin layer disposed over the ceramic layer, and a impedance element formed on the ceramic layer. The resin layer may be have an electronic component mounted thereon.

DESCRIPTION OF THE PREFERRED EMBODIMENTS (Exemplary Embodiment 1)

Figure 1:
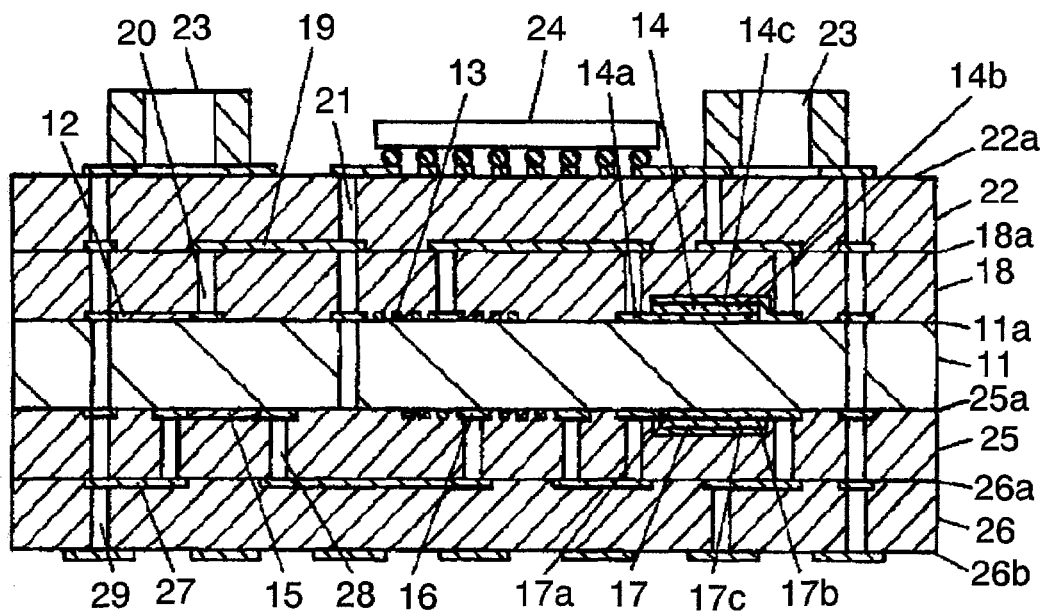
FIG. 1 is a sectional view of a multi-layer board in accordance with a first exemplary embodiment of the present invention.

In FIG. 1, a ceramic layer 11 having a relative dielectric constant of about 10 (at 1 MHz), has a top surface (a third surface) 11a provided with a resistor 12, inductor 13 and capacitor 14 formed thereon. The layer 11 has a bottom surface (a fourth surface) 25a provided with a resistor 15, inductor 16, and capacitor 17 formed thereon. These impedance elements, since being formed on both surfaces of the ceramic layer 11, are stable against an external temperature change.

A Resin layer 18 having a relative dielectric constant of about 4 (at 1 MHz) has a top surface (a second surface) 18a provided with a pattern 19 formed thereon. The pattern 19 is conducted to the third surface 11a with an interstitial via-hole (hereinafter referred to as a hole) 20 and to a first surface 22a with a hole 21 to be connected to circuits. Since the relative dielectric constants of resin layers 18, 22 are lower than that of ceramic layer 11, a strip line formed on the second surface 18a can be wide, thereby having a reduced loss. This is preferable particularly in high frequency performance for improving a noise factor (NF).

The resin layer 22 having a relative dielectric constant of about 4 (at 1 MHz) has a top surface (a first surface) 22a provided with a surface-mounted device (SMD) 23 and a bare chip device 24 mounted thereon.

The resin layers 25, 26 each having a relative dielectric constant of about 4 (at 1 MHz) has a fifth surface 26a provided with a pattern 27 formed thereon. The pattern 27 is conducted to a fourth surface 25a with a hole 28 and to a sixth surface 26b with a hole 29 to be connected to circuits. The hole 29 is a through-hole extending from the first surface 22a to the sixth surface 26b (from the top external surface to the bottom external surface of the multi-layer board).

Thus, the multi-layer board of the first embodiment has a six-surface structure, that is, includes the ceramic layer 11 as a core board, the resin layers 18, 22, 25, and 26 over both surfaces of the layer 11. The resistors 12, 15 and inductors 13, 16, since being formed on the ceramic layer 11, have respective characteristics stabilized against the temperature change, thus having accurately-maintained values.

The first surface 22a, since being provided with the SMD 23 and bare chip device 24 mounted thereon, contributes to an improved packaging-density, thus enabling the board to be small.

The resin layers 18, 22, 25, and 26 since being stacked over both surfaces of the ceramic layer 11, 25, allow the multi-layer board not to warp and to be mounted on a base board of an apparatus without a gap.

In the case that the base board is a resin board, the multi-layer board can be mounted in close contact with the base board if the resin layer, of the multi-layer board, contacting the base board is made of resin having a thermal expansion coefficient close to that of the base board.

Figure 2:
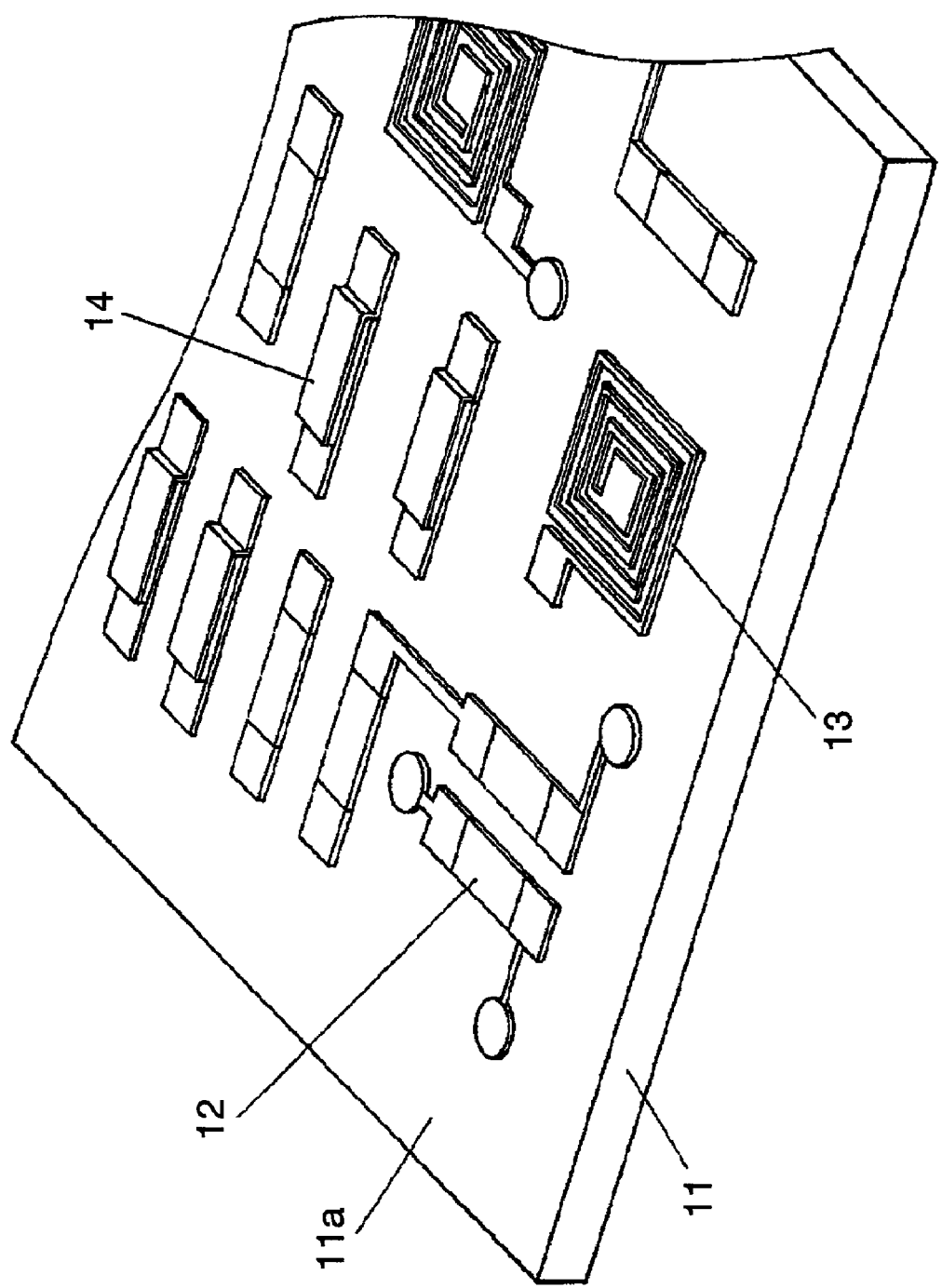
FIG. 2 is a perspective view of an essential part of the multi-layer board in accordance with the first embodiment.

FIG. 2 is a perspective view of the impedance elements, the resistor 12, inductor 13, and capacitor 14 on the third surface 11a of the ceramic layer 11. The resistor 12 and inductor 13 are laser-trimmed, thus having a resistance and inductance adjusted accurately, and thereby having stable performance. In addition, the inductor 13 is formed on the ceramic layer 11 having a large relative dielectric constant, thereby having a large inductance despite its reduced size. Furthermore, as clearly illustrated in FIG. 2, the inductor 13 is patterned so as to have a spiral shape.

If a portion, of the second surface 18a, corresponding to inductor 13 is not provided with a ground pattern formed on the surface, the inductor 13 has an increased Q-factor.

The capacitors 14, 17 include electrode layers 14a, 14c, 17a, and 17c and dielectric layers 14b, 17b which are formed by printing and sintering. The dielectric layers 14b, 17b, upon being made of high dielectric material, provide the capacitors 14, 17 with large capacitances despite their reduced sizes.

(Exemplary Embodiment 2)

Figure 3:
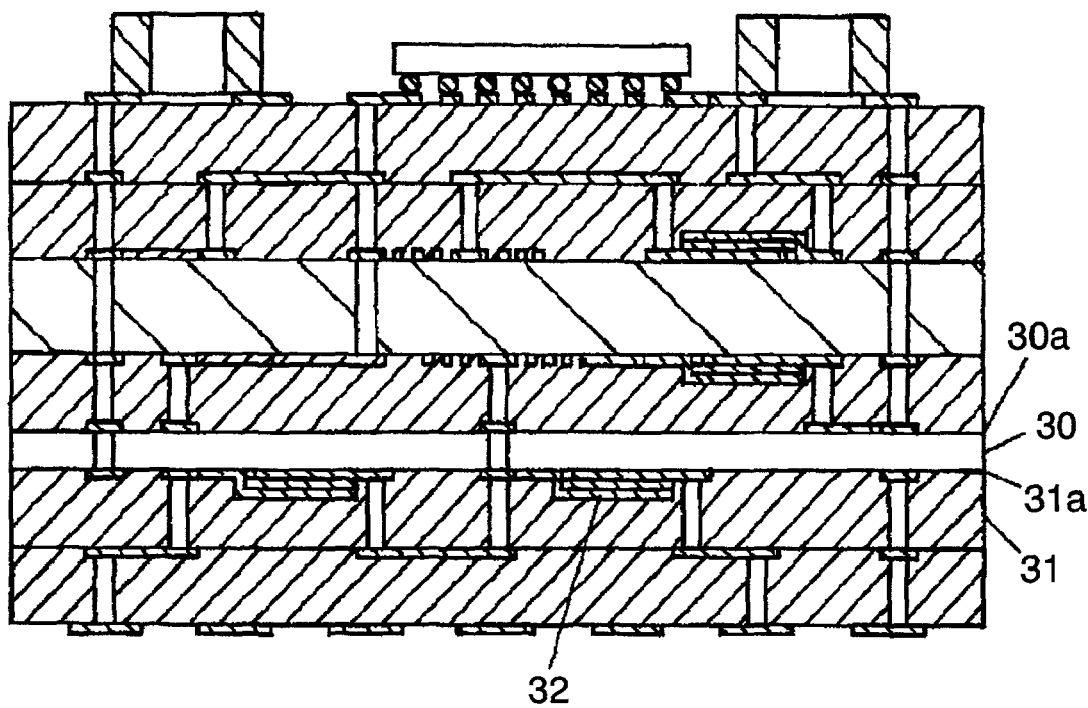
FIG. 3 is a sectional view of a multi-layer board in accordance with a second exemplary embodiment of the present invention.
Figure 4:
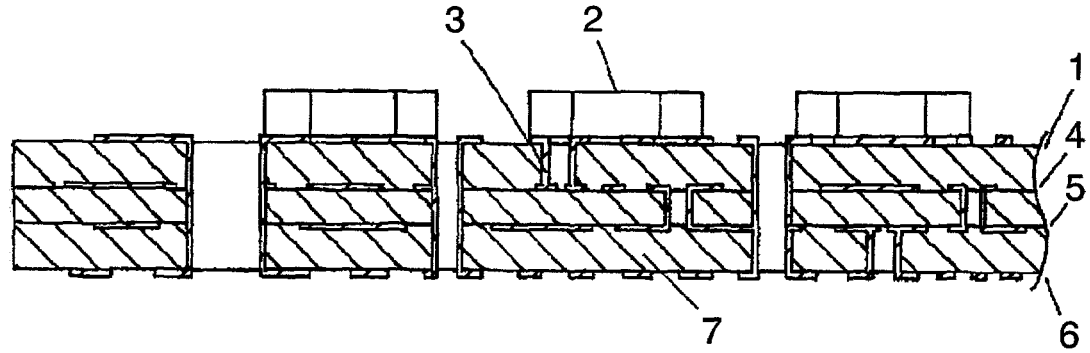
FIG. 4 is a sectional view of a conventional multi-layer board.

As illustrated with a sectional view of FIG. 3, a multi-layer board in accordance with a second exemplary embodiment includes eight surfaces. Instead of the fifth surface 26a of the board of the first embodiment, a fifth surface 30a defined by a polyimide film 30 and a sixth surface 31a defined by a resin layer 31 are inserted.

In FIG. 3, the sixth surface 31a of the polyimide film 30 is provided with a capacitor 32 formed by vapor deposition, so that the capacitor 32 has an accurate capacitance and a low profile.

Each multi-layer board of the first and second embodiments including the ceramic layer resists bending. Further, the multi-layer board is inexpensive since including the stacked resin layers, which are inexpensive.

What is claimed is:

1. A multi-layer board comprising:
   a ceramic layer having a first side and a second side opposite said first side, said ceramic layer having a dielectric constant;
   an impedance element on said ceramic layer, said impedance element comprising a patterned inductor;
   a first resin layer on said first side of said ceramic layer so as to contact said ceramic layer, said first resin layer having a dielectric constant lower than said dielectric constant of said ceramic layer, and having a first side facing said ceramic layer and a second side opposite said first side;
   a second resin layer on said second side of said ceramic layer so as to contact said ceramic layer;
   a third resin layer on said first resin layer so as to contact said first resin layer;
   a strip line between said first resin layer and said third resin layer; and
   a ground pattern on said second side of said first resin layer, said ground pattern and said patterned inductor being arranged such that no portion of said ground pattern is located on said second side of said first resin layer opposite a portion of said first side of said first resin layer facing said patterned inductor.

2. The multi-layer board of claim 1, further comprising an electronic component mounted on said first resin layer.

3. The multi-layer board of claim 1, further comprising a strip line on said third resin layer.

4. The multi-layer board of claim 1, further comprising an electronic component mounted on said third resin layer.

5. The multi-layer board of claim 1, further comprising a fourth resin layer on said third resin layer.

6. The multi-layer board of claim 1, wherein said patterned inductor comprises a laser-trimmed patterned inductor.

7. The multi-layer board of claim 1, wherein said impedance element comprises a resistor.

8. The multi-layer board of claim 7, wherein said resistor comprises a laser-trimmed resistor.

9. The multi-layer board of claim 1, wherein said impedance element comprises a first impedance element on said first side of said ceramic layer, further comprising a second impedance element on said second side of said ceramic layer.

10. The multi-layer board of claim 1, further comprising:
    a polyimide film between said first resin layer and said third resin layer; and
    a capacitor on said polyimide film.

11. The multi-layer board of claim 1, wherein said third resin layer has a dielectric constant lower than said dielectric constant of said ceramic layer.

12. A multi-layer board comprising:
    a ceramic layer having a first side and a second side opposite said first side;
    a first impedance element including a patterned inductor on said first side of said ceramic layer;
    a second impedance element on said second side of said ceramic layer;
    a resin layer over said first side of said ceramic layer, said resin layer having a first side facing said first side of said ceramic layer and having a second side opposite said first side of said resin layer; and
    a ground pattern on said second side of said resin layer, said ground pattern and said patterned inductor being arranged such that no portion of said ground pattern is located on a portion of said second side of said resin layer opposite a portion of said first side of said resin layer facing said patterned inductor so as to increase a Q-factor of said patterned inductor.

13. The multi-layer board of claim 12, further comprising an electronic component mounted on said resin layer.

14. The multi-layer board of claim 12, wherein said resin layer comprises a first resin layer over said first side of said ceramic layer, further comprising a second resin layer over said second side of said ceramic layer.

15. The multi-layer board of claim 14, further comprising a strip line on said second resin layer.

16. The multi-layer board of claim 14, further comprising a third resin layer over said first resin layer.

17. The multi-layer board of claim 16, further comprising a strip line on said third resin layer.

18. The multi-layer board of claim 16, further comprising an electronic component mounted on said third resin layer.

19. The multi-layer board of claim 16, further comprising a fourth resin layer between said first resin layer and said third resin layer.

20. The multi-layer board of claim 16, further comprising:
    a polyimide film between said first resin layer and said third resin layer; and
    a capacitor on said polyimide film.

21. The multi-layer board of claim 12, wherein said patterned inductor comprises a laser-trimmed patterned inductor.

22. The multi-layer board of claim 12, further comprising a strip line on said resin layer.

23. The multi-layer board of claim 12, wherein said resin layer has a dielectric constant lower than a dielectric constant of said ceramic layer.

24. The multi-layer board of claim 12, wherein said patterned inductor is arranged between said ceramic layer and said first resin layer.

25. The multi-layer board of claim 12, wherein said patterned inductor is arranged on said first side of said ceramic layer so as to contact said ceramic layer.

26. The multi-layer board of claim 12, wherein said patterned inductor has a spiral shape.

27. A multi-layer board comprising:
    a ceramic layer having a first side and a second side opposite said first side, said ceramic layer having a dielectric constant;
    a first impedance element on said first side of said ceramic layer;
    a second impedance element on said second side of said ceramic layer;
    a first resin layer on said first side of said ceramic layer so as to contact said ceramic layer, said first resin layer having a dielectric constant lower than said dielectric constant of said ceramic layer;
    a second resin layer on said second side of said ceramic layer so as to contact said ceramic layer;
    a third resin layer on said first resin layer so as to contact said first resin layer; and a strip line between said first resin layer and said third resin layer.

28. The multi-layer board of claim 27, further comprising an electronic component mounted on said first resin layer.

29. The multi-layer board of claim 27, further comprising a strip line on said third resin layer.

30. The multi-layer board of claim 27, further comprising an electronic component mounted on said third resin layer.

31. The multi-layer board of claim 27, further comprising a fourth resin layer on said third resin layer.

32. The multi-layer board of claim 27, wherein said first impedance element comprises a resistor.

33. The multi-layer board of claim 32, wherein said resistor comprises a laser-trimmed resistor.

* * * * *

UNITED STATES PATENT AND TRADEMARK OFFICE
CERTIFICATE OF CORRECTION

PATENT NO. : 7,161,241 B2  Page 1 of 1
APPLICATION NO. : 10/092548
DATED : January 9, 2007
INVENTOR(S) : Junichi Kimura It is certified that error appears in the above-identified patent and that said Letters Patent is hereby corrected as shown below:

On the Title Page

Item (56), References Cited, under U.S. Patent Documents, right column, line 5, change "6,545,353   B1" to --6,545,353   B2--.

Item (56), References Cited, under U.S. Patent Documents, right column, line 6, change "6,570,469   B1" to --6,570,469   B2--.

Item (56), References Cited, under U.S. Patent Documents, right column, line 7, change "6,586,682   B1" to --6,586,682   B2--.

Item (56), References Cited, under U.S. Patent Documents, right column, line 8, change "6,734,542   B1" to --6,734,542   B2--.

Signed and Sealed this

Seventeenth Day of April, 2007

JON W. DUDAS
*Director of the United States Patent and Trademark Office*